United States Patent
Watanabe et al.

(10) Patent No.: US 10,147,605 B2
(45) Date of Patent: Dec. 4, 2018

(54) PROCESS OF PRODUCING EPITAXIAL SUBSTRATE

(71) Applicant: SUMITOMO ELECTRIC DEVICE INNOVATIONS, INC., Yokohama-shi, Kanagawa (JP)

(72) Inventors: Tadashi Watanabe, Yokohama (JP); Hajime Matsuda, Yokohama (JP)

(73) Assignee: SUMITOMO ELECTRIC DEVICE INNOVATIONS, INC., Kanagawa (JP)

(*) Notice: Subject to any disclaimer, the term of this patent is extended or adjusted under 35 U.S.C. 154(b) by 0 days.

(21) Appl. No.: 15/820,596

(22) Filed: Nov. 22, 2017

(65) Prior Publication Data
US 2018/0151349 A1    May 31, 2018

(30) Foreign Application Priority Data

Nov. 30, 2016   (JP) .................. 2016-233138

(51) Int. Cl.
| | |
|---|---|
| H01L 21/02 | (2006.01) |
| C30B 25/02 | (2006.01) |
| H01L 29/20 | (2006.01) |
| H01L 29/205 | (2006.01) |
| H01L 29/66 | (2006.01) |
| H01L 29/778 | (2006.01) |

(52) U.S. Cl.
CPC .......... *H01L 21/0262* (2013.01); *C30B 25/02* (2013.01); *H01L 21/0254* (2013.01); *H01L 21/02378* (2013.01); *H01L 21/02458* (2013.01); *H01L 29/2003* (2013.01); *H01L 29/205* (2013.01); *H01L 29/66462* (2013.01); *H01L 29/7787* (2013.01)

(58) Field of Classification Search
CPC combination set(s) only.
See application file for complete search history.

(56) References Cited

U.S. PATENT DOCUMENTS

| | | | | |
|---|---|---|---|---|
| 2002/0054616 A1* | 5/2002 | Kamiyama | ............ | B82Y 20/00 372/45.011 |
| 2006/0191474 A1* | 8/2006 | Chen | ............ | B82Y 20/00 117/104 |
| 2008/0197359 A1 | 8/2008 | Imanishi et al. | | |

(Continued)

FOREIGN PATENT DOCUMENTS

JP    2011-023677    2/2011

OTHER PUBLICATIONS

U.S. Appl. No. 15/847,171, filed Dec. 19, 2017.

*Primary Examiner* — Mamadou Diallo
(74) *Attorney, Agent, or Firm* — Smith, Gambrell & Russell, LLP.

(57) ABSTRACT

A process of forming an epitaxial substrate that includes nitride semiconductor layers is disclosed. The process includes steps of; (a) growing a nucleus forming layer on the substrate, and (b) growing a nitride semiconductor layer on the nucleus forming layer. The step (a) sets first and second growth temperatures in an upstream side and a downstream side, respectively, of the substrate for the flow of the source gases, where the first temperature of the upstream side is at least 5° C. but at most 10° C. lower than the second temperature of the downstream side, and the second temperature is higher than 1100° C.

6 Claims, 10 Drawing Sheets

(56) References Cited

U.S. PATENT DOCUMENTS

| | | | |
|---|---|---|---|
| 2008/0308836 A1* | 12/2008 | Nakahara | H01L 21/0237 257/103 |
| 2014/0318443 A1* | 10/2014 | Fenwick | H01L 21/02381 117/102 |
| 2015/0140792 A1 | 5/2015 | Castaldi et al. | |
| 2017/0288046 A1* | 10/2017 | Miyamoto | H01L 21/0254 |

* cited by examiner

PROCESS OF PRODUCING EPITAXIAL SUBSTRATE

BACKGROUND OF INVENTION

1. Field of Invention

The present invention relates to a process of producing an epitaxial substrate.

2. Background Arts

An epitaxial substrate may be produced by growing semiconductor layers on a substrate. For instance, a metal organic chemical vapor deposition (MOCVD) technique may grow a nucleus forming layer on a substrate, thereafter nitride semiconductor layers on the nucleus forming layer. Forming electrodes of a source, a drain, and a gate, a semiconductor device type of field effect transistor (FET) may be formed from the epitaxial substrate. When the nucleus forming layer causes surface pits. The nitride semiconductor layers grown on the nucleus forming layer may leave pits on surfaces thereof that reflect the surface pits on the nucleus forming layer. The surface pits on the nitride semiconductor layer increases a drain leak current. Thus, a surface of the nucleus forming layer with reduced pit density may decrease the surface pit density on the surface of the nitride semiconductor layer thereby improves the performance of the semiconductor device. A Japanese Patent Application laid open No. JP-2011-023677 has reported a technique to reduce the surface pits on the nucleus forming layer by raising a growth temperature above 1100° C. However, dispersion of the drain leak current within a substrate increases as the growth temperature of the nucleus forming layer becomes higher.

SUMMARY OF INVENTION

An aspect of the present invention relates to a method of forming an epitaxial substrate that includes nitride semiconductor layers. The method comprising steps of: (a) growing a nucleus forming layer on a substrate by a metal organic chemical vapor deposition (MOCVD) technique using source gases for a group III element and nitrogen (N), the nucleus forming layer including nitride semiconductor material containing aluminum (Al) as the group III element and nitrogen (N); and (b) growing a nitride semiconductor layer on the nucleus forming layer by the MOCVD technique. A feature of the method of the present invention is that, the step of growing the nucleus forming layer sets a first growth temperature in an upstream side of the substrate and a second growth temperature in a downstream side of the substrate each with respect to a flow of the source gases, and the first growth temperature is lower than the second growth temperature, and the second growth temperature is higher than 1100° C.

BRIEF DESCRIPTION OF THE DRAWINGS

The invention will now be described by way of example only with reference to the accompanying drawings in which.

DESCRIPTION OF EMBODIMENTS

Next, embodiment according to the present invention will be described as referring to accompanying drawings. In the description of the drawings, numerals or symbols same with or similar to each other will refer to elements same with or similar to each other without duplicating explanations.

Figure 1:
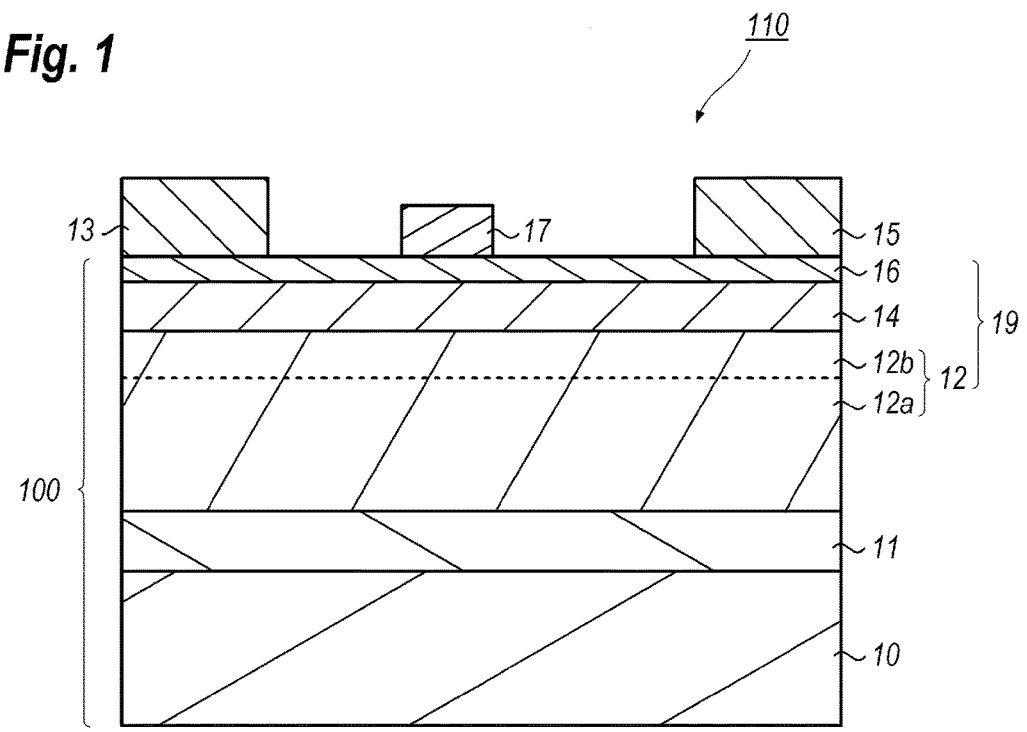
FIG. 1 shows a cross section of a semiconductor device that includes a semiconductor stack 100, a source electrode, a drain electrode, and a gate electrode, thereby forming a type of field effect transistor (FET)

FIG. 1 shows a cross section of a semiconductor device 110 that includes a semiconductor stack as an epitaxial substrate 100, a source electrode 13, a drain electrode 15, and a gate electrode 17; thereby forming an electronic device type of field effect transistor (FET). The epitaxial substrate 100 includes, on a semiconductor substrate 10, a nucleus forming layer 11 and nitride semiconductor stack 19 that includes a channel layer 12 made of gallium nitride (GaN) 12, a barrier layer 14, and a cap layer 16 stacked on the nucleus forming layer 11 in this order. The nucleus forming layer 11 is in contact with the substrate 10, while, the GaN channel layer 12 is in contact with the nucleus forming layer 11. Similarly, the barrier layer 14 is in contact with the GaN channel layer and the cap layer 16 is in contact with the barrier layer 14. The electrodes of the source 13, the drain 15, and the gate 17 are provided on the cap layer 16.

The substrate 10 may be made of, for instance, silicon carbide (SiC). The nucleus forming layer 11 may be made of aluminum nitride (AlN) with a thickness of about 13 nm. The channel layer 12 may be made of un-doped GaN with a thickness of about 0.6 μm, where a lower portion 12a of the GaN channel layer 12 may operate as a buffer layer, while, an upper portion 12b thereof provides a channel layer for transporting carriers in a two-dimensional electron gas (2DEG) induced by a hetero-interface against the barrier layer 14 because the barrier layer 14 in the present embodiment may be made of aluminum gallium nitride (AlGaN) with an aluminum composition of 0.22, where the AlGaN barrier layer 14 has bandgap energy greater than that of the GaN channel layer. The cap layer may be made of n-type GaN with a thickness of 5 nm.

The source electrode 13 and the drain electrode 15 may be formed by alloying a stacked metal of tantalum (Ta), aluminum (Al), and another tantalum (Ta), Ta/Al/Ta, under a temperature higher than 500° C. The gate electrode 17 has a stacked metal of nickel (Ni), palladium (Pd), and gold (Au), Ni/Pd/Au, where Ni makes a Schottky contact against the cap layer 16, Pd operates as a barrier for inter-diffusion between Ni and Au, and Au decreases gate resistance.

Figure 2A:
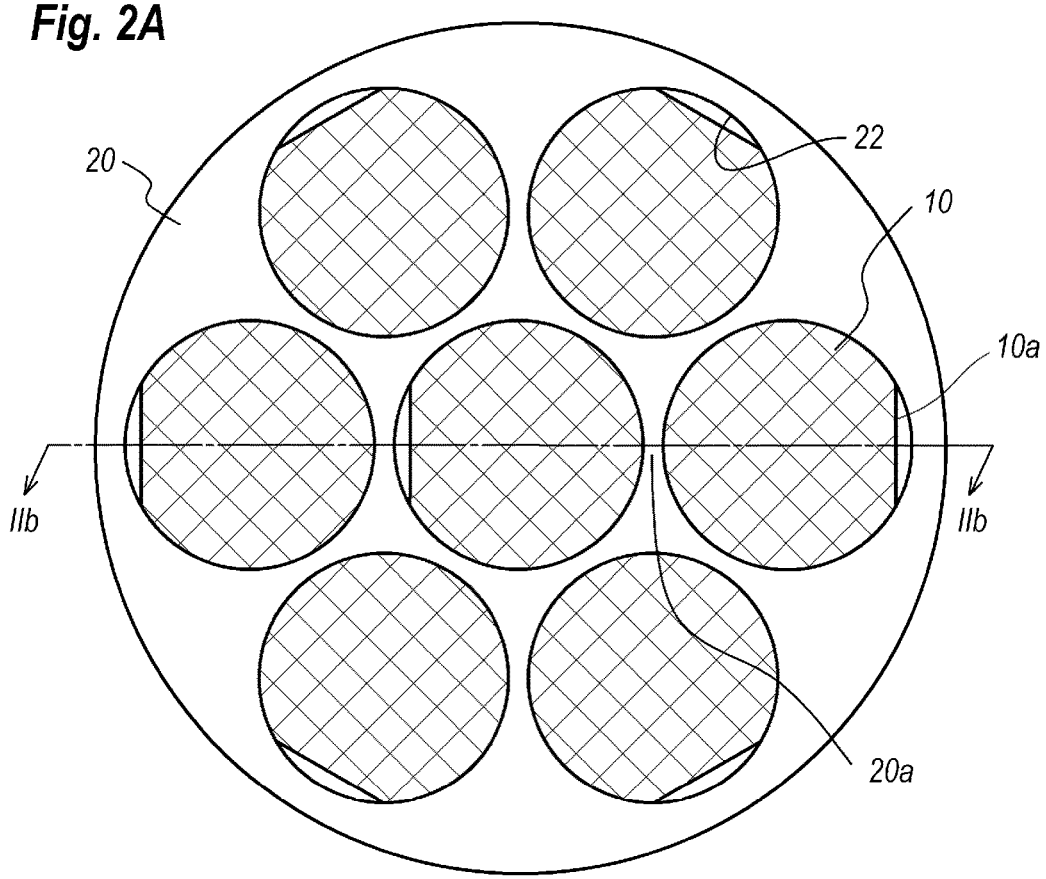
FIG. 2A is a plan view of a susceptor of the metal organic chemical vapor deposition (MOCVD) apparatus, where FIG. 2A omits a shower head from which source gases described below spout.

FIG. 2A is a plan view of a susceptor 20 implemented within the apparatus of the metal organic chemical vapor deposition (MOCVD) technique. The susceptor 20, as shown in FIG. 2A, has a circular plane shape and rotates around the center thereof during the process. FIG. 2A omits a shower head from which source materials spout. The susceptor 20 provides pockets 22 into which substrates 10 with diameters of four (4) inches are set such that respective orientation flats 10a face outward. Areas between the pockets 22 will be called as a stage 20a.

Figure 2B:
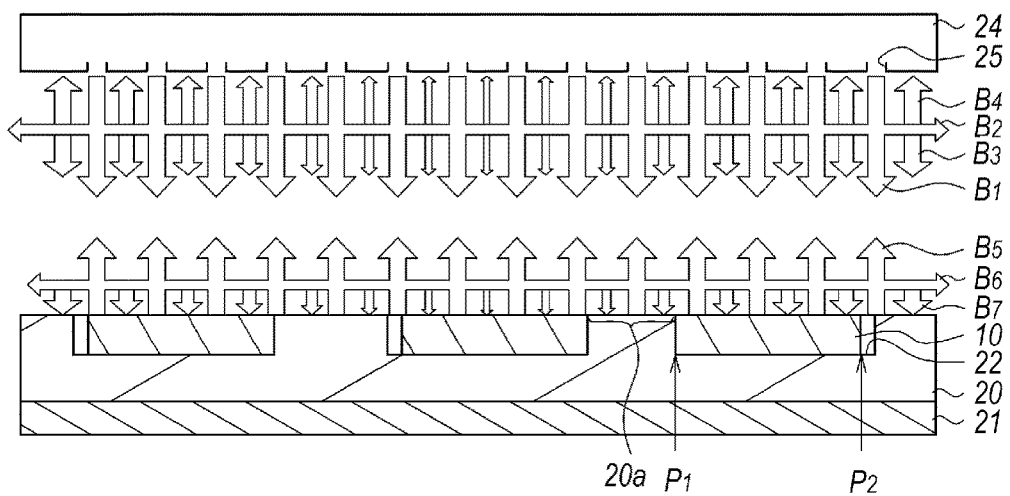
FIG. 2B shows a cross section of the susceptor and a substrate, which is taken along the line IIb-IIb indicated in FIG. 2A.

FIG. 2B shows a cross section of the susceptor 20 and a shower head 24 provided above the susceptor 20, where FIG. 2B is taken along the line IIb-IIb—indicated in FIG. 2A. The susceptor 20 provides a heater 21 thereunder to raise a temperature of the substrate 10 to a growth temperature. Supplying source gases from outlets 25 provided in the shower head 24 onto the surface of the substrates 10 set within the pockets 22, the nucleus forming layer 11, the GaN channel layer 12, the barrier layer 14, and the cap layer 16 are epitaxially and sequentially grown on the substrates 10.

As shown in FIG. 2B, the source gases spouting from the outlets 25 make not only a downward stream but an outward stream to the periphery of the susceptor 20. Specifically, flows denoted by arrows B1 for the source gases head downward to the susceptor 20 from the outlets 25; but portions of the source gases head outward to the periphery of the shower head 24 as denoted by arrows B2 to be exhausted from the reaction chamber of the MOCVD apparatus. Also, other flows denoted by arrows, B3 and B4, are formed within the reaction chamber. Moreover, the substrates 10 in the pockets 22 and the stage 22a sublimate the source materials from the materials deposited thereon, which generates other flows of the source gases denoted by an arrow B5, and a portion of the sublimated source materials head outward to the periphery of the susceptor 20 as dented by an arrow B6 and exhausted thereat. Still other portions of the sublimated sources directing the periphery of the susceptor 20 advance to the susceptor 20 again as denoted by arrows B7 and contribute the growth of the layers on the substrate 10. A position P1 in FIG. 2B corresponds to an upstream side of the flow of the source gas with respect to the substrate 10, while, another position P2 corresponds to a downstream side of the flow of the source gas.

Figure 4:
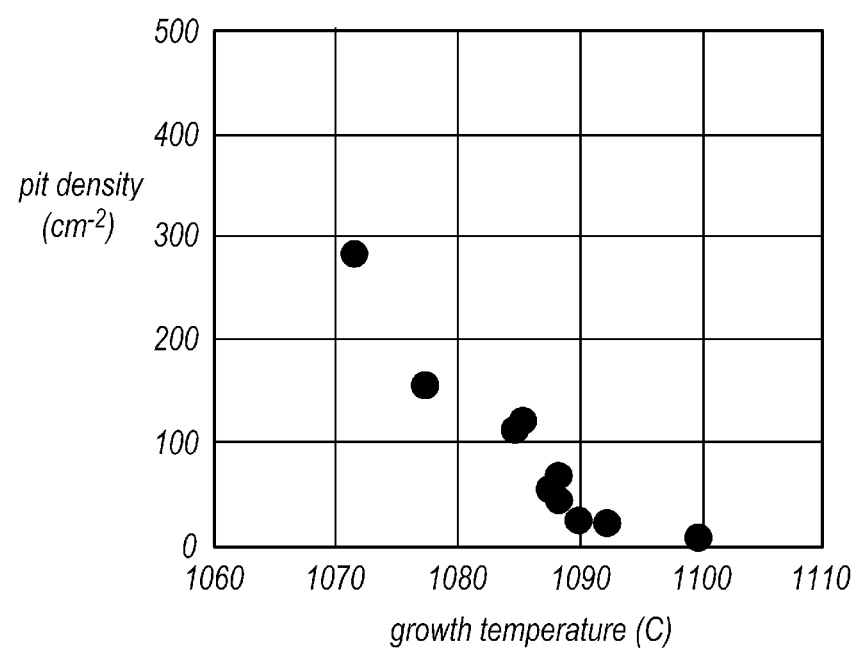
FIG. 4 shows a relation of the surface pit density against the growth temperature of the nucleus forming layer.
Figure 5:
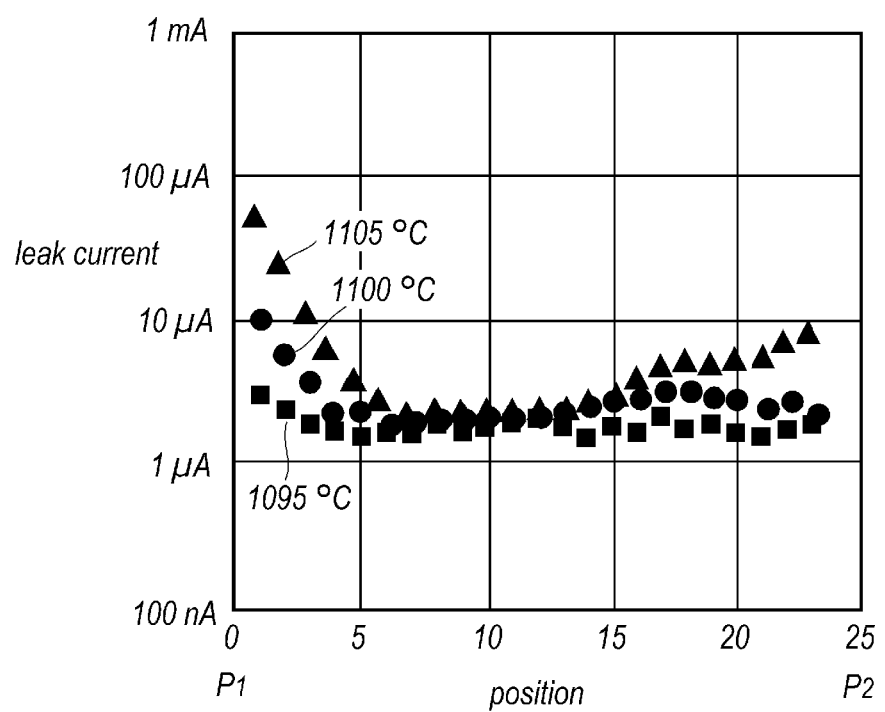
FIG. 5 shows behaviors of the drain leak current within the substrate where the nucleus forming layer were grown at growth temperatures of 1095, 1100, and 1105° C., respectively.

FIG. 4 shows the surface pit density (cm$^{-2}$) observed in the surface of the cap layer 16 against the growth temperature for the nucleus forming layer 11, which was counted through an optical microscope, while, FIG. 5 shows the drain leak current between the source electrode 13 and the drain electrode 15 without forming the gate electrode 17. As shown in FIGS. 4 and 5, the surface pit density was inconsistent with the reduction of the drain leak current; that is, the surface pit density decreased but the drain leak current increased as the growth temperature for the nucleus forming layer 11 was raised. The surface pit density becomes less than 50 cm$^{-2}$ for the growth temperature high than 1090° C. On the other hand, the drain leak current for the nucleus forming layer 11 grown at 1105° C. became more than almost ten times greater than that grown at the temperature of 1095° C. at the position P1 corresponding to the upstream side for the flow of the source gas with respect to the substrate 10.

FIG. 5 shows behaviors of the drain leak current within the substrate 10 where the nucleus forming layer 11 were grown at growth temperatures of 1095, 1100, and 1105° C. Horizontal axis in FIG. 5 corresponds to the position within the substrate 10, where the point P1 is in the upstream side for the flow of the source gases, while, the point P2 corresponds to the downstream side for the flow of the source gases, as shown in FIG. 2B. In other words, the point P1 locates in a center within the susceptor 20 compared with the point P2 that locates in a periphery of the susceptor 20.

Referring to FIG. 5, the drain leak current was increased as the growth temperature becomes higher. Also, the increase of the drain leak current exceeds in peripheries of the substrate 10 compared with a center thereof, where the peripheries corresponds to the position around 0 and 25 in FIG. 5, while, the center corresponds to the positions 10 to 15. Moreover, the upstream side of the substrate 10 for the source gases, which corresponds positions closer to 0 shows a tremendous increase of the drain leak current. Specifically, the drain leak current for the growth temperature of 1105° C. becomes about a hundred times larger than the drain leak current for the growth temperature of 1090° C. Thus, the drain leak current becomes larger as the growth temperature for the nucleus forming layer 11 becomes higher, in particular, the leak current observed in the upstream side of the substrate 10 for the flow of the source gases.

That is, the pit density may be reduced by raising the growth temperature for the nucleus forming layer 11 as shown in FIG. 4; however, the drain leak current not only increases the magnitude thereof but expands distribution within the substrate 10.

Leak current was evaluated for samples grown at 1095, 1100, 1105° C.; but the pit density showed almost zero, or few, for those growth temperatures. Based on those experiments, it is hard to say that the pit density becomes inconsistent with the leak current.

Impurities captured within the nucleus forming layer 11 during the growth thereof may increase the drain leak current. Contaminations such as silicon (Si) atoms and/or oxygen (O) atoms, which may be contained within the source gases and an air, easily invade into the growth chamber of the MOCVD apparatus, which causes deposit adhered to walls of the growth chamber, the susceptor 20, onto the stage 20a of the susceptor 20, and so on. Raising the growth temperature, which enhances sublimation of the deposit, the growing nucleus forming layer 11 may easily capture the deposit as donor impurities to convert the nucleus forming layer 11 into an n-type layer, which may increase the drain leak current flowing in the nucleus forming layer 11. Also, captured impurities in the nucleus forming layer 11 may easily diffuse into the GaN channel layer 12, and so on during the growth of the layers, which also increases the drain leak current.

As FIG. 5 indicates, the upstream side for the flow of the source gases with respect to the substrate 10 shows greater drain leak current, in particular, when the growth temperature for the nucleus forming layer 11 reaches 1105° C., the drain leak current becomes almost ten times greater than that for the growth temperature of 1100° C., and almost a hundred times greater than that for the growth temperature of 1095° C.

One reason for the increase of the leak current in the upstream side of the substrate 10 is that, the susceptor 20 accumulates the deposits on the stage 20a around the pockets 22. In particular, the upstream side of the susceptor 20 for the flow of the source gases, that is, a center portion of the susceptor 20 accumulates many deposits compared with the peripheral portion of the susceptor 20 for the flow of the source gases. Accordingly, the substrate 10 in a portion positioned in the center of the susceptor 20, that is, the positions 0 to 5 in FIG. 5, may capture more impurities compared with the downstream side of the substrate 10 for the flow of the source gases. Accordingly, the upstream side of the substrate 10, the positions, 0 to 5, causes greater drain leak currents compared with the leak current observed in the downstream side of the substrate 10, namely, the positions 20 to 25 in FIG. 5.

In another reason, non-uniform distribution of the growth temperature within the substrate 10 may cause large distribution of the leak current. When the substrate 10 is bent downward, that is, when the substrate 10 in a cross section thereof shows a reversed U-character, the substrate 10 in peripheries thereof show higher temperature during the growth of the nucleus forming layer 11 compared with a center of the substrate 10. Thus, the peripheries of the substrate 10, in particular, a periphery of the substrate 10 in the upstream side for the flow of the source gases may capture more impurities. Accordingly, the leak current in the periphery of the substrate 10, in particular, the upstream side of the substrate for the flow of the source gases may show a larger leak current.

First Embodiment

Table 1 blow summarizes the growth conditions of the nucleus forming layer 11 and the nitride semiconductor layers, 12 to 16, in the semiconductor stack 19 according to the first embodiment of the present invention. The first embodiment sets a temperature gradient during the growth of the nucleus forming layer 11. That is, for the growth of the nucleus forming layer 11, the growth temperature in the downstream side of the substrate 10 for the flow of the source gases is set higher than the growth temperature for the upstream side of the substrate 10; specifically, the growth temperature of the downstream side of the substrate 10 for the flow of the source gases is set to be 1110° C., which is at least 5° C. higher than the growth temperature for the upstream side of the substrate 10 for the flow of the source gases.

TABLE 1

| Layer | thickness (nm) | pressure (Torr) | temperature (° C.) | source flow rate |
|---|---|---|---|---|
| nucleus forming layer 11 | 13 | 100 | downstream: 1110 upstream: 1100~1105 | TMA: 130 sccm NH$_3$: 15 slm |
| GaN channel layer 12 | 600 | | 1060 | TMG: 54 sccm NH$_3$: 20 slm |
| barrier layer 14 | 24 | | | TMG: 37 sccm TMA: 137 sccm NH$_3$: 22.5 slm SiH$_4$: 5.8 sccm |
| cap layer 16 | 5 | | | TMG: 63 sccm NH$_3$: 22.5 slm SiH$_4$: 22.4 sccm |

In Table 1 above, TMA, TMG, NH3 and SiH4 mean tri-methyl aluminum, tri-methyl gallium, ammonia, and silane, respectively. Also, one (1) Torr corresponds to 133.3 Pascal (Pa), one (1) sccm is $1.667 \times 10^{-8}$ m$^3$/sec, and one (1) slm is $1.667 \times 10^{-11}$ m$^3$/sec.

Figure 3A:
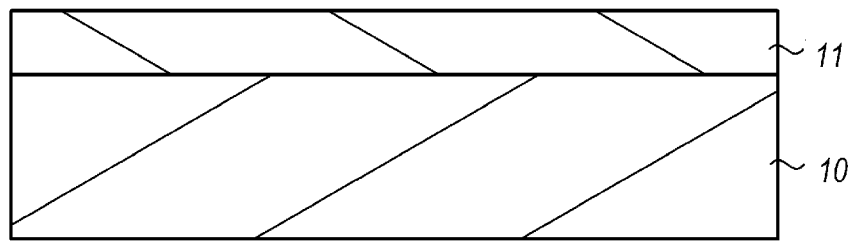
FIGS. 3A and 3B show cross sections of an epitaxial substrate at respective processes.
Figure 3B:
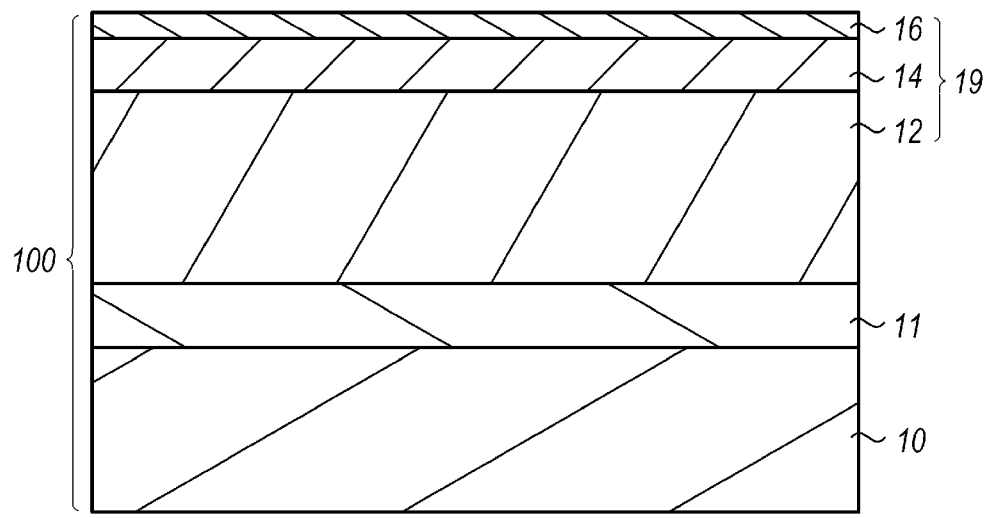

The process of forming a semiconductor device 110 according to the first embodiment of the present invention will be described. FIGS. 3A and 3B show processes of forming the semiconductor device. The process first sets the substrate 10 made of silicon carbide (SiC) within the pocket 22 of the susceptor 20 such that the orientation flat 10a of the substrate 10 faces outward. Supplying hydrogen (H2) and setting the pressure within the growth chamber to be 100 Torr, the susceptor 20 in a temperature thereof is maintained at 1140° C. for 20 minutes. Then, setting the temperature of the susceptor 20 at a growth temperature for the nucleus forming layer 11 and supplying the TMA and NH3 by flow rates shown in table 1 above, the process epitaxially grows the nucleus forming layer 11 with a thickness of 13 nm; specifically, the temperature of the upstream side of the substrate 10 for the flow of the source gases, namely, the side of the substrate 10 opposite to the orientation flat is set to be 1100 to 1105° C., while, the temperature of the downstream side of the substrate 10, namely, the side with the orientation flat, is set to be 1110° C. Thereafter, supplying the source gases of TMA and NH3 with the flow rates of 130 sccm and 15 slm, respectively, the nucleus forming layer 11 may be grown on the substrate 10 with the thickness of 13 nm. Thus, the temperature of the substrate 10 in the upstream side for the flow of the source gases is at least 5° C. lower than the temperature of the substrate 10 in the downstream side for the flow of the source gases.

Subsequently, the semiconductor layers from the GaN channel layer 12 to the cap layer 16 of the semiconductor stack 19 are sequentially grown on the nucleus forming layer 11 by respective conditions listed in table 1 above to form an epitaxial substrate 100 that includes from the substrate 10 to the cap layer 16. Finally, the source electrode 13, the drain electrode 15, and the gate electrode 17 are formed on the cap layer 16 as shown in FIG. 1. Surface pit density appearing on the surface of the semiconductor stack 19, namely, the surface of the cap layer 16, and the drain leak current between the source electrode 13 and the drain electrode 15 were evaluated for epitaxial substrates having nucleus forming layers 11 grown under various conditions shown in table 1.

Figure 6:
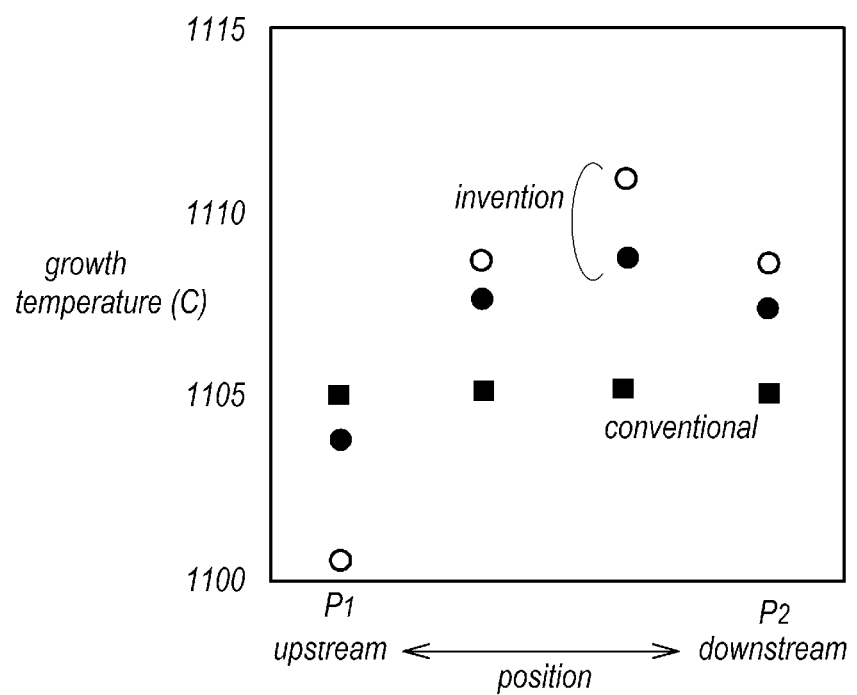
FIG. 6 shows the temperature distribution of the susceptor during the growth of the nucleus forming layer.

FIG. 6 shows the temperature distribution of the susceptor 20 during the growth of the nucleus forming layer 11. As shown in FIG. 6, the conventional process denoted by filled squares keeps the growth temperature uniform at 1105° C. within the substrate 10; while, the embodiment of the present invention denoted by open circles and filled circles set the growth temperature in the upstream side for the flow of the source gases higher than the growth temperature in the downstream side by at least 5° C., specifically, the condition denoted by the filled circles sets the temperature in the upstream side by 5° C. lower than the growth temperature of the downstream side; while, the other condition denoted by the open circles sets the difference in the growth temperature between the upstream side and the downstream side by about 10° C.

Figure 7:
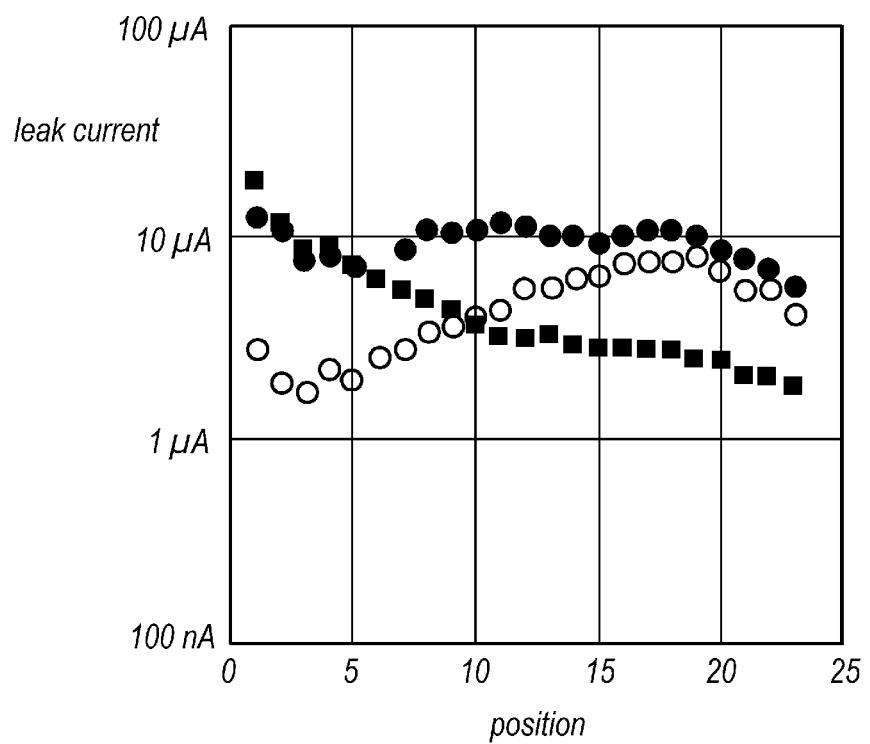
FIG. 7 shows distributions of the drain leak current within the substrate where the growth temperatures thereof correspond to those shown in FIG. 6.

FIG. 7 compares the distribution of the drain leak current within the substrates 10 whose nucleus forming layers 11 are grown by the conditions shown in FIG. 6. The epitaxial substrate grown by the conventional condition shows the drain leak current in the upstream side for the flow of the source gases about 10 times greater than the drain leak current in the downstream side. On the other hand, the epitaxial substrate 100 whose nucleus forming layer 11 is grown by the condition denoted by the filled circles in FIG. 6 may suppress the width of the distribution in the leak current. Also, the other epitaxial substrate 100 whose nucleus forming layer 11 is grown by the condition denoted by the open circles in FIG. 6 shows the distribution such that the drain leak current in the upstream side for the flow of the source gases becomes smaller than the drain leak current in the downstream side, which is opposite to that of the epitaxial substrate grown by the conventional condition. In those measurements, the drain leak current in the magnitude thereof is determined by the current flowing from the drain electrode to the source electrode under the drain bias of 50 V and the gate is deeply biased so as to fully turn off the transistor.

Lowering the growth temperature for the nucleus forming layer 11 in the upstream side of the substrate 10 for the flow of the source gases, the grown nucleus forming layer 11 may suppress the capture of the donor impurities, such as silicon (Si) and oxygen (O), which effectively reduces the drain leak current. In particular, because the temperature in the upstream side of the substrate for the flow of the source gases is lowered, not raising the temperature of the downstream side, the capture of the donor impurities form the residual deposits may be effectively suppressed. Also, lowering the growth temperature, which makes the TMA hard to be dissolved and enhances the capture of carbon (C) atoms in the TMA within the growing nucleus forming layer 11, the carbon (C) may compensate the donor impurities in the upstream side of the substrate 10 for the flow of the source gases. Accordingly, the distribution of the drain leak current may become uniform. The growth temperature for the nucleus forming layer 11 in the upstream side of the substrate 10 for the flow of the source gases is at least 5° C. and at most 10° C. lower than the growth temperature in the downstream side.

In order to reduce the drain leak current, the process simply lowers the growth temperature for the nucleus forming layer 11. However, as FIG. 4 clearly shows, the lowered growth temperature for the nucleus forming layer 11 possibly increases the surface pit density. Accordingly, the process may lower the temperature only in the upstream side of the substrate 10 for the flow of the source gases by 5 to 10° C. compared with the growth temperature in the downstream side. As FIG. 4 also shows, the surface pit density becomes small enough, or substantially zero, for the growth temperature of 1100±5° C.

Because the growth temperature for the nucleus forming layer 11 in the downstream side of the substrate 10 for the flow of the source gases is set higher than 1100° C., which may reduce the surface pit density enough, as shown in FIG. 4. The growth temperature for the nucleus forming layer 11 in the upstream side of the substrate 10 for the flow of the source gases is preferably 1090 to 1095° C.; because such a temperature may make the surface pit density small enough as shown in FIG. 4.

The process sequentially and continuously grows the GaN channel layer 12 on the nucleus forming layer 11, which means the grown GaN channel layer 12 may easily capture the deposits left on the susceptor 20 during the growth of the nucleus forming layer 11. However, the process grows the GaN channel layer 12 under the temperature of 1060° C., which is lower than the growth temperature of the nucleus forming layer 11 regardless of the upstream side and the downstream side of the substrate 10 for the flow of the source gases. Accordingly, the capture of the impurities derived from the deposits left on the susceptor 20 may be suppressed during the growth of the GaN channel layer 12.

The GaN channel layer 12 may be grown under the uniform temperature distribution, specifically, a temperature difference between the upstream side and the downstream side is preferably set smaller than 2° C. Accordingly, the distribution of the captured impurities becomes small, although the capture itself is smaller than the nucleus forming layer 11, which also suppresses the distribution of the drain leak current. The barrier layer 14 and the cap layer 16 may show situations same with that for the GaN channel layer 12. That is, the growth temperatures for the barrier layer 14 and the cap layer 16 are set lower than that for the nucleus forming layer 11.

Second Embodiment

Figure 8:
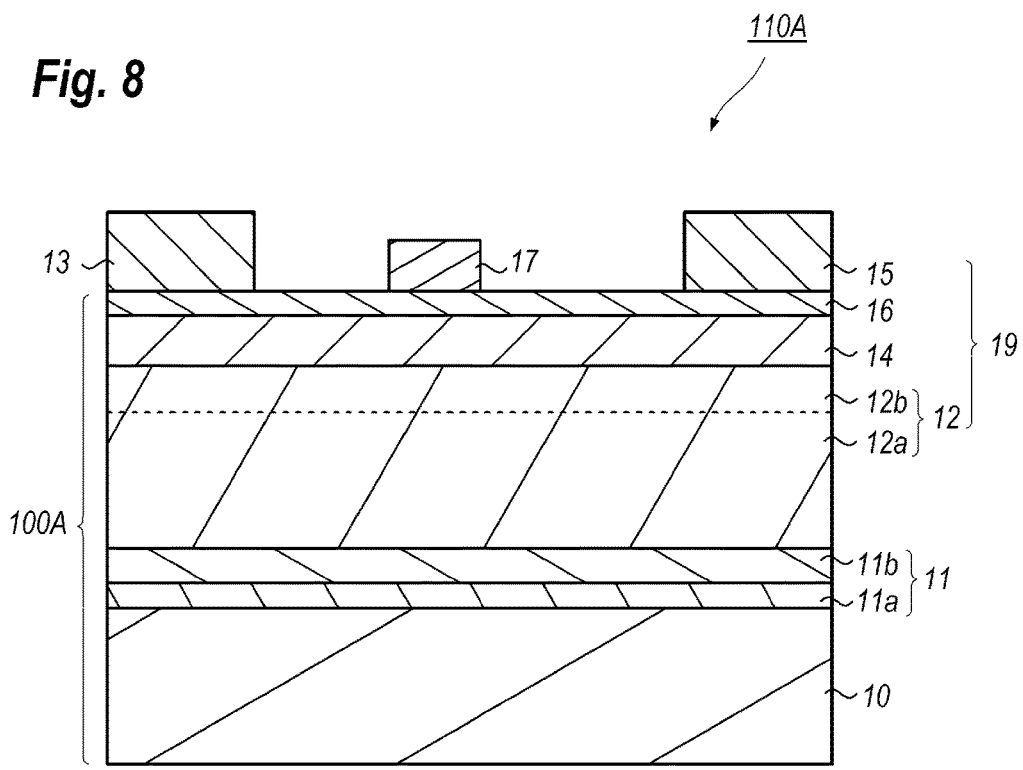
FIG. 8 shows a cross section of another semiconductor device according to the second embodiment of the invention.

The second embodiment according to the present invention grows the nucleus forming layer 11 in two steps, that is, the nucleus forming layer 11 provides two layers. FIG. 8 shows a cross section of the semiconductor device 110A according to the second embodiment where the nucleus forming layer 11 includes a lower layer 11a and an upper layer 11b. The lower layer 11a is in contact with the substrate 10, while, the upper layer 11b is put between the lower layer 11a and the GaN channel layer 12. The semiconductor stack 19 is formed on the upper layer 11b. The lower layer 11a is made of AlN with a thickness of 5 nm, while, the upper layer 11b is also made of AlN but with a thickness of 8 nm.

Table 2 below summarizes the conditions for growing the nucleus forming layer 11 and the semiconductor stack 19:

TABLE 2

| Layer | thickness (nm) | conditions |  |  |
|---|---|---|---|---|
|  |  | pressure (Torr) | temperature (° C.) | source/flow rate |
| lower layer 11a | 3~7 | 100 | 1100 | TMA: 130 sccm |
| upper layer 11b | 3~17 |  | 1090 | NH$_3$: 15 slm |
| GaN channel layer 12 | 600 |  | 1060 | TMG: 54 sccm<br>NH$_3$: 20 slm |
| barrier layer 14 | 24 |  |  | TMG: 37 sccm<br>TMA: 137 sccm<br>NH$_3$: 22.5 slm<br>SiH$_4$: 5.8 sccm |
| cap layer 16 | 5 |  |  | TMG: 63 sccm<br>NH$_3$: 22.5 slm<br>SiH$_4$: 22.4 sccm |

As listed in the table 2 above, the growth temperature of the lower layer 11a is 1100° C., while, that for the upper layer 11b is set to be 1090° C., which is lower than the former temperature by 10° C. During the growth of the lower layer 11a and the upper layer 11b, no temperature gradient is applied to the substrate 10.

Figure 9A:
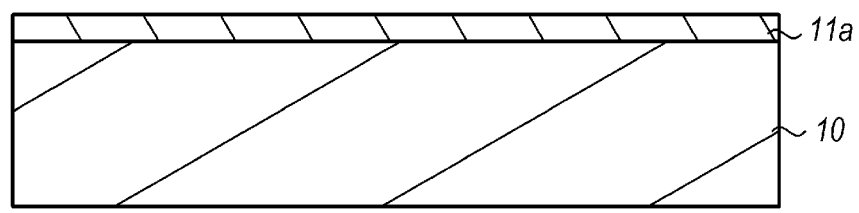
FIGS. 9A and 9B show cross sections at respective steps of forming an epitaxial substrate for the semiconductor device shown in FIG. 8.
Figure 9B:
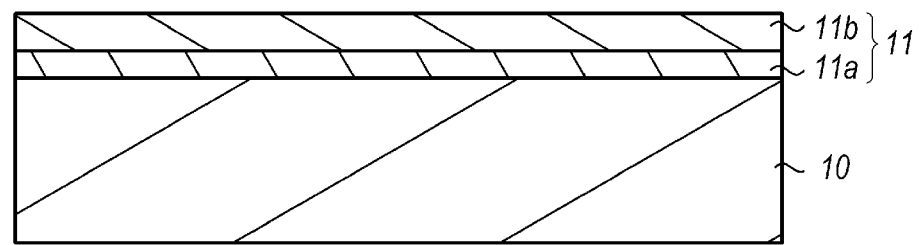

The process of forming the semiconductor device 110A will be described as referring to FIG. 9A and FIG. 9B each show cross sections of the semiconductor device 110A at respective processes. Setting the temperature of the substrate 10 to be 1100° C. and supplying the source gases of TMA and NH3 with flow rates of 130 sccm and 15 slm, respectively, the lower layer 11a made of AlN may be grown on the substrate 10 by a thickness of 3 to 7 nm as shown in FIG. 9A.

Thereafter, lowering the temperature of the substrate to be 1090° C. as ceasing the supplement of TMA but continuously supplying only NH3 within the MOCVD apparatus, exactly, the growth chamber of the MOCVD apparatus, the dissociation of nitrogen (N) from the grown lower layer 11a may be suppressed. After the temperature stabilizes at the growth temperature for the upper layer 11*b*, the upper layer 11*b* made of AlN may be grown on the lower layer 11*a* with a thickness of 3 to 17 nm by resuming the supplement of TMA. The upper layer 11*b* preferably has a thickness of 3 to 17 nm which is greater than that of the lower layer 11*a*. The growth of the semiconductor stack 19 is done by the manners same with those of the first embodiment.

The second embodiment according to the present invention may make the uniform distribution of the drain leak current within the substrate 10 consistent with the reduction of the surface pit density. The substrate 10 made of SiC possibly causes pits on the surface of the nucleus forming layer 11 made of AlN due to a lattice mismatching therebetween. However, raising the growth temperature for the lower layer 11*a* to, for instance, 1100° C. like the present embodiment, the surface pit density may be reduced. The upper layer 11*b* is grown at the temperature of 1095° C., which is lower than that for the lower layer 11*a* and possibly causes the surface pit density; but, the upper layer 11*b* interposes the lower layer 11*a* with respect to the substrate 10, and is apart from the substrate 10 by the thickness of the lower layer 11*a*. Accordingly, the pits possibly caused in the surface of the upper layer 11*b* may be decreased.

Also, because of a lowered growth temperature for the upper layer 11*b*, the upper layer 11*b* is hard to capture the donor impurities and enhance the capture of the acceptor impurities, specifically, carbon atoms contained in the source gases, which may effectively compensate the donors in the grown layer. Thus, the drain leak current may be reduced. The growth temperature for the upper layer 11*b* is preferably lowered to, for instance, around 1090° C.

Lowered growth temperature for the upper layer 11*b* may suppress the capture of the impurities from the deposits accumulated on the stage 20*a* of the susceptor 20, in particular, the capture at the upstream side of the substrate 10 for the flow of the source gases, which may suppress the dispersion of the drain leak current within the substrate 10.

Moreover, a raised growth temperature for the upper layer 11*a* may reduce the surface pits possibly caused on the surface of the upper layer 11*b*. However, excessively raised temperature for the upper layer 11*b* may accelerate the capture of the impurities, which increases the drain leak current. Accordingly, the growth temperature for the lower layer 11*a* is preferably lower than 1115° C., or further preferably lower than 1110° C. A lowered growth temperature for the upper layer 11*b* may reduce the drain leak current, but an excessively lowered growth temperature may cause the increase of the surface pit density. Accordingly, the growth temperature for the upper layer 11*b* is preferably lower than that of the lower layer 11*a* by 5 to 10° C.

It is preferable for the nucleus forming layer 11 to have an enough thickness for forming the semiconductor stack 19 thereon. Therefore, the nucleus forming layer 11 in a thickness thereof is set to be 6 to 20 nm; exactly, the lower layer 11*a* preferably has a thickness of 3 to 7 nm, while, the upper layer 11*b* has a thickness of 3 to 17 nm and thicker than the lower layer 11*a*. Setting the lower layer 11*a* thin because the lower layer 11*a* is hard to cause the pits, while, setting the upper layer 11*b* thick, although they are generally mutually inconsistent requests for a single layer, the reduction of the surface pits and the reduction of the drain leak current become compatible in the present embodiment. That is, forming the lower layer 11*a* thin at a relatively raised growth temperature, which may reduce the pit density, while, forming the upper layer 11*b* thick at a relatively lowered growth temperature, which may reduce the drain leak current, the mutually inconsistent conditions may be compatible.

Figure 10A:
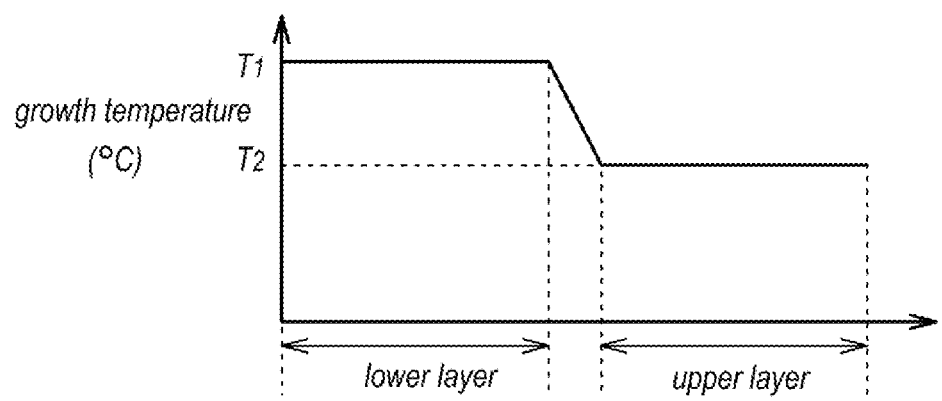
FIG. 10A and FIG. 10B show temperature variations during growth of the first and second nucleus forming layer according to embodiment of the present invention.
Figure 10B:
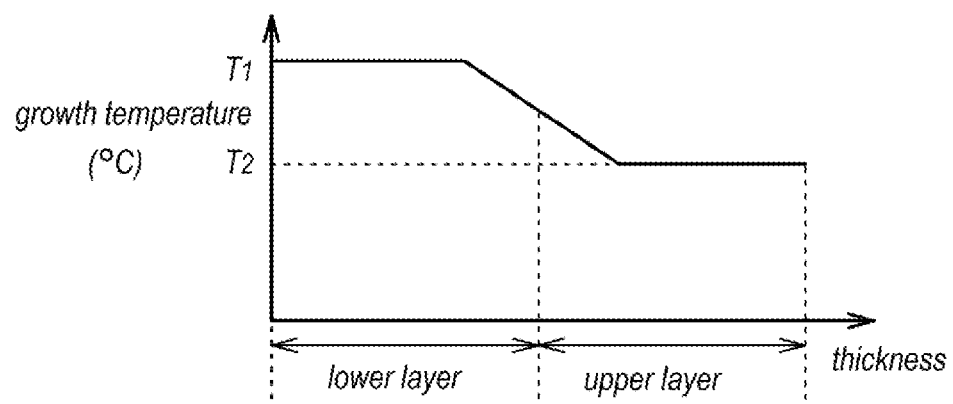

FIG. 10A and FIG. 10B schematically illustrate sequences of the growth temperature for the lower layer 11*a* and the upper layer 11*b*. The horizontal axis corresponds to the thickness measured from the substrate 10, while, the vertical axis denotes the growth temperature. FIG. 10A shows a sequence where the lower layer is grown at the temperature of 1100° C., lowering the growth temperature as ceasing the epitaxial growth by cutting the supplement of the source gas for the group III element, namely aluminum (Al) in the embodiment, and after the temperature stabilizes at the lowered temperature, for instance, 1090° C., the growth of the upper layer 11*b* resumes at the temperature of $T_2$ lower than the former temperature $T_1$.

FIG. 10B shows another sequence for the growth of the duplicated nucleus forming layer 11. That is, the embodiment grows the lower layer 11*a* first at the growth temperature of $T_1$, for instance, 1100° C.; then gradually lowers the growth temperature from $T_1$ to $T_2$. During the lowering of the growth temperature, the source gases, TMA and $NH_3$, in the flow rates thereof are maintained, and only the growth temperature is lowered from $T_1$ to $T_2$. Thus, the embodiment whose sequence is shown in FIG. 10B may shorten the growth time. In an alternative, the growth temperature may be gradually, continuously, and monotonically lowered from $T_1$ to $T_2$ from the beginning of the growth through the end of the growth.

After the growth of the upper layer 11*b*, the process grows the GaN channel layer at the growth temperature of, for instance, 1060° C., which is lower than the growth temperature for the upper layer 11*b*. Thus, the capture of the impurities during the change of the growth temperature from $T_2$ to 1060° C. may be suppressed. Also, the growth temperature for the GaN layer 12 is uniform within the substrate 10, which suppresses the distribution of the impurities captured during the growth and also the dispersion of the drain leak current within the substrate 10. The barrier layer 14 and the cap layer 16 are also grown at the respective temperatures lower than the growth temperature for the upper layer 11*b*, and set to be uniform in the substrate 10.

In an alternative, a combination of the first embodiment with the second embodiment may be applicable. For instance, the lower layer 11*a* may be grown under the conditions listed in table 2, that is, under the growth temperature of 1100° C. that is uniform within the substrate 10, while, the upper layer 11*b* is grown under the conditions listed in table 2, that is, the upstream side of the substrate 10 for the flow of the source gases is set lower compared with the temperature of the downstream side. Thus, the drain leak current in the distribution within the substrate 10 may be suppressed.

Finally, an insulating film made of, for instance, silicon nitride (SiN), silicon oxide ($SiO_2$), silicon oxy-nitride (SiON) may cover the surface of the semiconductor stack 19 to prevent moistures from invading into the semiconductor stack 19. Also, the semiconductor stack 19 may be applicable except for an FET, and the semiconductor stack 19 may form electrodes except for the source 13, the drain 15, and the gate 17.

The semiconductor stack 19, which includes nitride semiconductors, may provide, except for GaN and AlGaN, indium gallium nitride (InGaN), indium nitride (InN), indium aluminum nitride (InAlN), indium aluminum gallium nitride (InAlGaN), and so on. The substrate 10 may be made of, except for SiC, silicon (Si), sapphire ($Al_2O_3$), GaN, and so on.

Although the present invention has been described in detail, other variations are possible. Therefore, the spirit and the scope of the claims should not be limited to the description of the version contained herein. The foregoing description of preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

This application claims the benefit under 35 USC § 119(a) of Japanese Patent Application No. 2016-233138, filed on Nov. 30, 2016, the entire disclosure of which is incorporated herein by reference for all purposes.

What is claimed is:

1. A method of forming an epitaxial substrate that includes nitride semiconductor layers, the method comprising steps of:
growing a nucleus forming layer on a substrate by a metal organic chemical vapor deposition (MOCVD) technique using source gases for a group III element and nitrogen (N), the nucleus forming layer including nitride semiconductor material containing aluminum (Al) as the group III element and nitrogen (N); and
growing a nitride semiconductor layer on the nucleus forming layer by the MOCVD technique,
wherein the step of growing the nucleus forming layer sets a first growth temperature in an upstream side of the substrate with respect to flow of the source gases and a second growth temperature in a downstream side of the substrate with respect to the flow of the source gases, and
wherein the first growth temperature is lower than the second growth temperature and the second growth temperature is higher than 1100° C.

2. The method according to claim 1,
wherein the step of growing the nucleus forming layer sets the first growth temperature at least 5° C. but at most 10° C. lower than the second growth temperature.

3. The method according to claim 1,
wherein the step of growing the nitride semiconductor layer grows a GaN layer on the nucleus forming layer, and
wherein the step of growing the nitride semiconductor layer sets a first growth temperature in the upstream side of the substrate and a second growth temperature in the downstream side of the substrate, the first growth temperature and the second growth temperature for growing the nitride semiconductor layer being lower than the first growth temperature of the nucleus forming layer and lower than the second growth temperature of the nucleus forming layer, respectively, and
wherein the step of growing the nitride semiconductor layer sets a difference between the first growth temperature thereof and the second growth temperature thereof smaller than a difference between the first growth temperature and the second growth temperature in the step of growing the nucleus forming layer.

4. The method according to claim 1,
wherein the step of growing the nucleus forming layer grows at least one of aluminum nitride (AlN) and aluminum gallium nitride (AlGaN).

5. The method according to claim 1,
wherein the MOCVD technique uses an apparatus that includes a susceptor and a shower head facing the susceptor in an up and down arrangement, the susceptor having the substrate thereon, the shower head spouting the source gases toward the substrate on the susceptor, the source gases radially spreading from a center to a periphery of the susceptor, and
wherein the upstream side of the substrate faces the center of the susceptor and the downstream side of the substrate faces the periphery of the susceptor.

6. The method according to claim 5,
wherein the substrate provides an orientation flat that indexes a crystal orientation, and
wherein the step of growing the nucleus forming layer sets the substrate on the susceptor such that the orientation flat thereof faces outward toward the periphery of the susceptor.

* * * * *